United States Patent
Tokushige et al.

(10) Patent No.: US 11,465,255 B2
(45) Date of Patent: Oct. 11, 2022

(54) LAPPING MATERIAL AND METHOD FOR PRODUCING THE SAME, AND METHOD FOR PRODUCING POLISHED PRODUCT

(71) Applicant: FUJIBO HOLDINGS, INC., Tokyo (JP)

(72) Inventors: Shin Tokushige, Ehime (JP); Keisuke Nakase, Tokyo (JP); Hiroshi Kurihara, Ehime (JP); Hiroshi Kashiwada, Ehime (JP); Kenichi Koike, Ehime (JP)

(73) Assignee: FUJIBO HOLDINGS, INC., Tokyo (JP)

( * ) Notice: Subject to any disclaimer, the term of this patent is extended or adjusted under 35 U.S.C. 154(b) by 977 days.

(21) Appl. No.: 15/770,435

(22) PCT Filed: Oct. 25, 2016

(86) PCT No.: PCT/JP2016/081563
§ 371 (c)(1),
(2) Date: Apr. 23, 2018

(87) PCT Pub. No.: WO2017/073556
PCT Pub. Date: May 4, 2017

(65) Prior Publication Data
US 2018/0311782 A1    Nov. 1, 2018

(30) Foreign Application Priority Data

Oct. 27, 2015 (JP) .............................. JP2015-211275

(51) Int. Cl.
*B24B 37/24* (2012.01)
*B24D 3/00* (2006.01)
(Continued)

(52) U.S. Cl.
CPC .............. *B24B 37/24* (2013.01); *B24D 3/002* (2013.01); *B24D 3/28* (2013.01); *B24D 18/0027* (2013.01); *H01L 21/304* (2013.01)

(58) Field of Classification Search
CPC ......... B24B 37/24; B24B 37/22; B24D 3/002; B24D 3/28; B24D 18/0027; B24D 11/00;
(Continued)

(56) References Cited

U.S. PATENT DOCUMENTS

| | | | | |
|---|---|---|---|---|
| 4,692,365 A | * | 9/1987 | Kralzsch ............... | B24D 3/002 428/85 |
| 6,769,975 B2 | * | 8/2004 | Sagawa .................. | B24D 18/00 51/307 |

(Continued)

FOREIGN PATENT DOCUMENTS

| | | |
|---|---|---|
| JP | H05-008178 A | 1/1993 |
| JP | H05-162085 A | 6/1993 |

(Continued)

*Primary Examiner* — Lee D Wilson
*Assistant Examiner* — Alberto Saenz
(74) *Attorney, Agent, or Firm* — Squire Patton Boggs (US) LLP

(57) ABSTRACT

A lapping material having a knitted fabric constituted by warp knitting or weft knitting, and a resin with which the knitted fabric is impregnated.

10 Claims, 2 Drawing Sheets

(51) Int. Cl.
 *B24D 3/28* (2006.01)
 *B24D 18/00* (2006.01)
 *H01L 21/304* (2006.01)

(58) Field of Classification Search
 CPC ... B24D 11/003; B24D 11/005; B24D 11/006; B24D 11/02; B24D 3/004; B24D 13/147; B24D 15/04
 USPC .......... 451/532, 533, 534, 536, 526
 See application file for complete search history.

(56) References Cited

U.S. PATENT DOCUMENTS

| | | | | |
|---|---|---|---|---|
| 2004/0055223 | A1* | 3/2004 | Ono | B24D 3/28 51/293 |
| 2011/0130077 | A1* | 6/2011 | Litke | B24B 37/22 451/41 |
| 2014/0033615 | A1* | 2/2014 | Itoyama | B24B 37/24 51/296 |
| 2016/0193716 | A1* | 7/2016 | Sharmila | B24D 3/002 51/298 |
| 2017/0050288 | A1* | 2/2017 | Liao | B24B 37/24 |
| 2017/0225291 | A1* | 8/2017 | Takachi | C08G 18/6674 |
| 2018/0133868 | A1* | 5/2018 | Schumacher | D06N 3/007 |
| 2018/0281148 | A1* | 10/2018 | Lehuu | B24B 37/245 |

FOREIGN PATENT DOCUMENTS

| | | |
|---|---|---|
| JP | 2007-061961 A | 3/2007 |
| JP | 2008-207318 A | 9/2008 |
| JP | 2010-029996 A | 2/2010 |
| JP | 2010-188482 A | 9/2010 |
| JP | 2013-182952 A | 9/2013 |

* cited by examiner

LAPPING MATERIAL AND METHOD FOR PRODUCING THE SAME, AND METHOD FOR PRODUCING POLISHED PRODUCT

TECHNICAL FIELD

The present invention relates to a lapping material and a method for producing the same, and a method for producing a polished product.

BACKGROUND ART

In recent years, materials such as silicon carbide (SiC), gallium nitride (GaN), diamond, sapphire ($Al_2O_3$) and aluminum nitride (AlN), which are wide band-gap semiconductors, have attracted attention as next-generation power semiconductor element materials. For example, silicon carbide (SiC) has excellent physical property values such as a band gap 3 times and a breakdown electric field strength about 7 times those of Si semiconductors, and is excellent in high-temperature operability and also small in size and high in energy-saving effect as compared with current silicon semiconductors. In addition, sapphire wafers are increasingly of importance in electronic equipment having optical elements, such as components for high-performance overhead projectors, due to their chemical stability, optical characteristics (transparency), mechanical strength, thermal characteristics (heat conductivity), and the like. In order to really spread such next-generation power devices, an increase in the substrate diameter and the mass production of substrates are promoted, and the importance of substrate processing techniques is also increased along therewith. In such a processing process, a cylindrical single crystal (ingot) for use in wafers is sliced and thus cut out into a disc shape, as in Si. Next, the surface of the disc-shaped single crystal obtained by slicing is flattened by, first, conducting lapping processing by use of a lapping platen for rough removal of the roughness of the surface, and thereafter conducting polishing processing for a further enhancement in the flatness of the surface of the disc-shaped single crystal and for removal of fine scratches on the surface for mirror finishing. Accordingly, it is important to conduct lapping processing to thereby enhance the flatness of the disc-shaped single crystal surface and also decrease fine scratches, because the subsequent polishing processing is affected.

Conventionally, a cloth for semiconductor wafer polishing, in which a felt-like fibrous sheet is impregnated with a thermoplastic polyurethane resin, an expanded polyurethane polishing pad, and the like have been used in polishing processing of a common Si semiconductor wafer or the like (see, for example, Patent Literature 1). In addition, there is known, as lapping processing for a high-hardness material such as SiC much higher in hardness than Si, in particular, lapping processing where a metallic platen of copper, tin, and the like is used and the platen and a diamond abrasive grain are combined (hereinafter, also referred to as "diamond lapping".) (see, for example, Patent Literature 2).

CITATION LIST

Patent Literatures

Patent Literature 1: Japanese Patent Laid-Open No. H05-8178
Patent Literature 2: Japanese Patent Laid-Open No. 2007-61961

SUMMARY OF INVENTION

Technical Problem

A metallic platen, however, is heavy, and thus is difficult to handle, and furthermore has the following problem: it takes an effort to conduct the maintenance after use, for example, the care for a platen surface in which a diamond abrasive grain is embedded. In addition, when a common polishing cloth for use in polishing processing of Si is adopted for processing of SiC or the like, the cloth has the problem of being low in lapping rate and being not suitable for practical use. Furthermore, sapphire, in addition to SiC, has a modified Mohs hardness next to those of diamond and SiC, is high in resistance to chemicals and is extremely difficult to process. Therefore, there is demanded a lapping material excellent in handleability and also excellent in lapping rate in lapping processing of a material expected as a next-generation power semiconductor element material, in particular, a high-hardness difficult-to-process material, besides a common Si semiconductor wafer and the like.

The present invention has been made in view of the above circumstances, and an object thereof is to provide a lapping material excellent in handleability and maintainability and also excellent in lapping rate, and a method for producing the lapping material, as well as a method for producing a polished product by use of the lapping material.

Solution to Problem

The present inventors have made intensive studies in order to solve the above problems. As a result, the inventors have found that the above problems can be solved by a lapping material provided with a knitted fabric, thereby leading to completion of the present invention.

That is, the present invention is as follows.

[1]
A lapping material comprising a knitted fabric constituted by warp knitting or weft knitting, and a resin with which the knitted fabric is impregnated.

[2]
The lapping material according to [1], wherein at least a part of a fiber constituting the knitted fabric is a false twisted yarn.

[3]
The lapping material according to [1] or [2], wherein
the resin comprises a first resin and a second resin different from the first resin, and
the second resin is a reaction product of a urethane prepolymer having an NCO equivalent of 400 or less and a curing agent.

[4]
The lapping material according to any one of [1] to [3], wherein
the resin comprises a first resin and a second resin different from the first resin, and
a content of the knitted fabric is 30 to 60% by mass based on a total amount of the knitted fabric, the first resin and the second resin.

[5]
The lapping material according to any one of [1] to [4], wherein a number average diameter of a single yarn constituting the knitted fabric is 3 to 30 μm.

[6]
The lapping material according to any one of [1] to [5], wherein a surface roughness Ra of a polishing surface is 25 to 80 μm.

[7]

The lapping material according to any one of [1] to [6], having a compressibility of 0.5 to 20%.

[8]

The lapping material according to any one of [1] to [7], having a compressive elastic modulus of 50 to 98%.

[9]

The lapping material according to any one of [1] to [8], having an type A hardness of 50 to 98°.

[10]

The lapping material according to any one of [1] to [9], having a thickness of 1.0 to 5.0 mm.

[11]

A method for producing a lapping material, comprising:

a primary impregnation step of impregnating a knitted fabric constituted by warp knitting or weft knitting with a resin solution comprising a first resin, and conducting wet coagulation to thereby provide a resin-impregnated knitted fabric, an immersion step of immersing the resin-impregnated knitted fabric in an immersion liquid comprising a solvent in which the first resin can be soluble, and a secondary impregnation step of impregnating the resin-impregnated knitted fabric after the immersion step with a solution comprising a urethane prepolymer having an NCO equivalent of 400 or less and a curing agent.

[12]

The method for producing a lapping material according to [11], wherein the first resin can be soluble in one or more selected from the group consisting of N,N-dimethylformaldehyde, dimethylacetamide, methyl ethyl ketone and dimethylsulfoxide.

[13]

The method for producing a lapping material according to [11] or [12], wherein the solvent comprises one or more solvents selected from the group consisting of N,N-dimethylformaldehyde, dimethylacetamide, methyl ethyl ketone and dimethylsulfoxide.

[14]

A method for producing a polished product, comprising:

a lapping step of lapping a workpiece by use of the lapping material according to any one of [1] to [10].

Advantageous Effect of Invention

The present invention can provide a lapping material excellent in handleability and maintainability and also excellent in lapping rate, and a method for producing the lapping material, as well as a method for producing a polished product by use of the lapping material.

DESCRIPTION OF EMBODIMENTS

Figure 1:
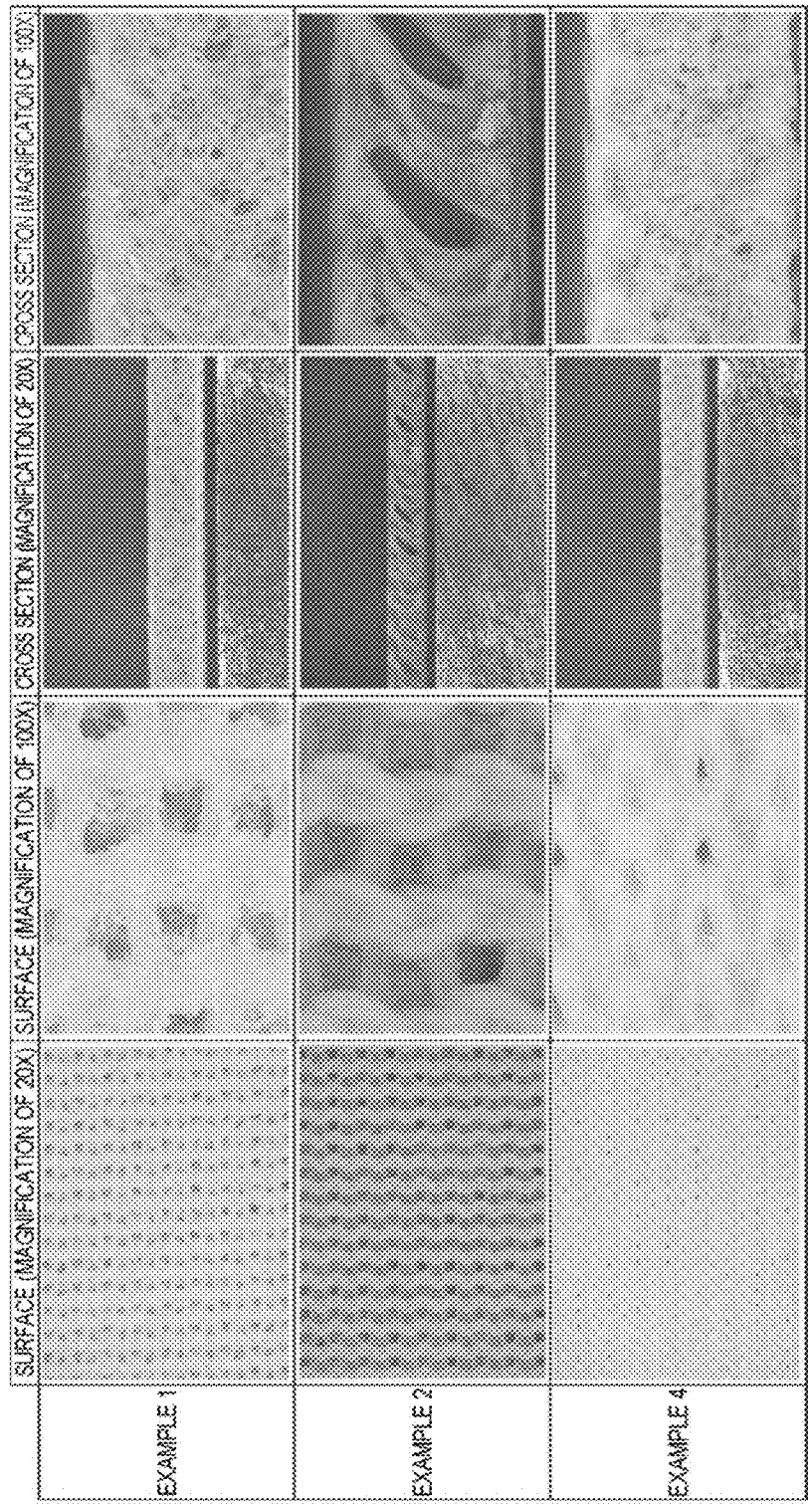
FIG. 1 shows microscope photographs illustrating the surfaces and the cross sections of lapping materials obtained in each of Examples 1, 2 and 4.

Hereinafter, an embodiment (hereinafter, simply referred to as "the present embodiment".) for carrying out the present invention will be described in detail, if necessary, with reference to the drawings. In addition, the positional relationship among up and down, left and right, and the like is based on the positional relationship illustrated in the drawings, unless particularly noted. Furthermore, the dimensional ratio in the drawings is not limited to the ratio illustrated.

[Lapping Material]

A lapping material of the present embodiment includes a knitted fabric constituted by warp knitting or weft knitting, and a resin with which the knitted fabric is impregnated. The lapping material of the present embodiment includes the knitted fabric and the resin, and thus is light in weight and excellent in handleability and maintainability as compared with a metallic platen. It is also surprisingly possible to impart an excellent lapping rate and exhibit a lapping rate comparable with that of a metallic platen, by use of the knitted fabric constituted by warp knitting or weft knitting.

The surface roughness Ra of the polishing surface of the lapping material is preferably 25 to 80 μm, more preferably 30 to 75 μm, further preferably 35 to 70 μm. When the surface roughness Ra is 25 μm or more, the lapping rate tends to be more enhanced. In addition, when the surface roughness Ra is 75 μm or less, surface quality of a workpiece tends to be more enhanced. The surface roughness Ra can be measured by a method described in Examples. The surface roughness Ra can also be adjusted by selecting, for example, a knitting system of the knitted fabric, the type of a fiber constituting the knitted fabric, a fiber twisting method, the number average diameter of a single yarn, and the like.

The compressibility of the lapping material is preferably 0.5 to 20%, more preferably 1 to 10%, further preferably 1 to 5%. When the compressibility is 0.5% or more, surface quality of a workpiece tends to be more enhanced to more enhance close contactability of the lapping material and the workpiece. In addition, when the compressibility is 20% or less, the lapping rate tends to be able to be more enhanced to more suppress deformation of the lapping material. Herein, the compressibility can be measured by a method described in Examples. The compressibility tends to be increased by, for example, adjusting the density of the resulting lapping material to a low value in a preferable production method described below.

The compressive elastic modulus of the lapping material is preferably 50 to 98%, more preferably 70 to 95%, further preferably 80 to 90%. When the compressive elastic modulus is 50% or more, the lapping rate tends to be able to be more enhanced to more suppress deformation of the lapping material. In addition, when the compressive elastic modulus is 98% or less, close contactability with a workpiece tends to be more enhanced. Herein, the compressive elastic modulus can be measured by a method described in Examples. The compressive elastic modulus tends to be increased by, for example, increasing the content of a second resin in a preferable production method described below.

The type A hardness of the lapping material is preferably 50 to 98°, more preferably 60 to 95°, further preferably 70 to 95°. When the type A hardness is 50° or more, deformation of the lapping material tends to be able to be more suppressed. In addition, when the type A hardness is 98° or less, close contactability with a workpiece tends to be more enhanced. Herein, the type A hardness can be measured by a method described in Examples. The type A hardness tends to be increased by, for example, increasing the content of a second resin in a preferable production method described below.

The density of the lapping material is preferably 0.35 to 0.70, more preferably 0.35 to 0.60, further preferably 0.40 to 0.60. When the density is 0.35 or more, a reduction in pressure at the point of action due to the permanent strain of the lapping material and an increase in the contact area with a workpiece tends to be able to be more suppressed. In addition, when the density is 0.70 or less, slurry retention ability tends to be more enhanced. Herein, the density can be measured by a method described in Examples. The density tends to be increased by, for example, increasing the contents of a first resin and a second resin in the knitted fabric in a preferable production method described below.

The thickness of the lapping material is preferably 1.0 to 5.0 mm, more preferably 1.5 to 3.5 mm, further preferably 2.0 to 3.0 mm. When the thickness is 1.0 mm or more, conformability to a workpiece tends to be more enhanced. In addition, when the thickness is 5.0 mm or less, deformation (waviness or surface shape) of a workpiece tends to be more improved. Herein, the thickness can be measured by a method described in Examples. The thickness can be adjusted by, for example, selecting a knitting system of the knitted fabric.

[Knitted Fabric]

The knitted fabric is constituted by warp knitting or weft knitting. The knitted fabric constituted by warp knitting or weft knitting has a regular knitting structure as compared with a non-woven fabric, and thus the internal structure of the lapping material is more uniform. Therefore, the distribution state of the resin for impregnation is also uniform, and an enhancement in the lapping rate can be achieved. In addition, the surface of the knitted fabric has regular protrusions and depressions (knots) as compared with the surface of a non-woven fabric. In such regular protrusions and depressions, the depressions act as, for example, an abrasive grain holding part in polishing by use of an abrasive grain. Therefore, the abrasive grain can be more efficiently held, and the lapping rate can be enhanced. In addition, in such regular protrusions and depressions, the protrusions can allow the abrasive grain to effectively act, and can contribute to an enhancement in the lapping rate. Furthermore, a regular distribution of protrusions and depressions enables more even polishing to be achieved, and can contribute to achievement of polishing imparting excellent surface quality.

In comparison with a metal platen made with an abrasive grain holding part formed thereon, the knitted fabric has the following advantages: a production step of purposely forming an abrasive grain holding part is not experienced, and the type of a knitting system of the knitted fabric and the fiber diameter can be adjusted to thereby easily form an abrasive grain holding part at any size and distribution. Additionally, the knitted fabric is light in weight as compared with the metal platen, and thus also has an advantage in handleability and also has an advantage in production cost and/or maintenance cost.

Lapping processing may be conducted at multiple stages including rough lapping (primary lapping) and finishing lapping (secondary lapping). Conventionally, primary lapping has been made by mechanical polishing using a metal platen of copper, tin, cast iron or the like and a diamond free abrasive grain from the viewpoint that the lapping speed is emphasized, and secondary lapping has been made by mechanical polishing using a resin-impregnated non-woven fabric pad or an expanded urethane resin pad for use in so-called CMP polishing and a diamond free abrasive grain from the viewpoint that accuracy such as surface quality is emphasized.

The lapping material of the present embodiment can be used for both of such primary lapping application and secondary lapping application. In particular, the change in knitting system of the knitted fabric enables a lapping material depending on the required lapping rate and surface quality to be easily constituted. For example, the surface of a knitted fabric constituted by warp knitting tends to have relatively deep depressions formed, and is suitable for the primary lapping where a higher lapping rate is demanded. In addition, the surface of a knitted fabric formed by weft knitting tends to have relatively shallow depressions formed and can apply a more uniform polishing pressure to a surface to be polished of a workpiece, and therefore is suitable for the secondary lapping where polishing accuracy such as a higher surface quality is demanded.

That is, the lapping material of the present embodiment, while satisfying a lapping rate and surface quality close to those of a conventional metal platen, has an advantage in handleability or the like, and therefore can be used as an alternative for a metal platen for conventional primary lapping, and also the lapping material has the advantage of satisfying higher lapping rate and surface quality than those of a conventional resin-impregnated non-woven fabric pad or the like and therefore can be used as an alternative for a resin-impregnated non-woven fabric pad or the like for conventional secondary lapping.

The warp knitting is not here particularly limited, and examples include tricot such as single tricot and double tricot; raschel such as single raschel and double raschel; and milanese. The warp knitting is preferably raschel from the viewpoint that the effect of the present invention is more effectively exerted.

The weft knitting is not particularly limited, and examples include circular knitting such as single knitting and double knitting; and flat knitting such as rib knitting, interlock stitch and flat pearl knitting. The single knitting is not particularly limited, and examples include sinker top circular knitting, French circular knitting and Tompkins knitting. The double knitting is not particularly limited, and examples include rib circular knitting, circular interlock knitting and cardboard knitting. The weft knitting is preferably circular knitting from the viewpoint that the effect of the present invention is more effectively exerted.

The fiber constituting the knitted fabric is not particularly limited, and examples include a fiber of polyester such as polyethylene terephthalate, polybutylene terephthalate and polylactate; a fiber of polyamide such as nylon 6, nylon 66, nylon 11, nylon 12 and nylon 610; and a fiber of polyolefin such as polyethylene and polypropylene.

At least a part of the fiber constituting the knitted fabric is preferably a false twisted yarn. When the false twisted yarn is used, the internal structure of the knitted fabric, while having a regular knitting structure, has a structure where an interfiber space is filled with a fiber twisted, as compared with the case of no false twisted yarn used. Thus, the interfiber space is decreased and the fiber twisted is easily impregnated with the resin, and therefore the fiber constituting the knitted fabric and the resin are more uniformly distributed in the internal structure of the lapping material. As a result, the internal structure of the lapping material is more uniform and the lapping rate tends to be more enhanced. When the false twisted yarn is used, impregnation ability of the knitted fabric with the resin also tends to be more enhanced.

A fiber mainly constituting the front and rear surfaces of the knitted fabric and a fiber mainly constituting the intermediate structure (structure located between the front and rear surfaces) of the knitted fabric may be different from each other. The types of the fiber mainly constituting the front and rear surfaces of the knitted fabric and the fiber mainly constituting the intermediate structure of the knitted fabric can be appropriately adjusted depending on the knitting system and fiber selection. For example, when grey yarn is used as the fiber mainly constituting the front and rear surfaces of the knitted fabric, the lapping rate tends to be more enhanced, and when the false twisted yarn is used, surface quality tends to be more enhanced. On the contrary, when the false twisted yarn is used as the fiber mainly constituting the intermediate structure of the knitted fabric, the internal structure of the lapping material is more uniform and the lapping rate tends to be more enhanced, as described above. Examples of a preferable combination from the viewpoint of an enhancement in the lapping rate in the primary lapping or the like include a combination where the fiber mainly constituting the front and rear surfaces of the knitted fabric is grey yarn and the fiber mainly constituting the intermediate structure of the knitted fabric is a false twisted yarn. Examples of a preferable combination from the viewpoint that the surface quality and the lapping rate are simultaneously satisfied in the secondary lapping or the like include a combination where the fiber mainly constituting the front and rear surfaces of the knitted fabric is grey yarn and the fiber mainly constituting the intermediate structure of the knitted fabric is grey yarn, and a combination where the fiber mainly constituting the front and rear surfaces of the knitted fabric is a false twisted yarn and the fiber mainly constituting the intermediate structure of the knitted fabric is a false twisted yarn.

The number average diameter of the single yarn constituting the knitted fabric is preferably 3 to 30 µm, more preferably 5 to 25 µm, further preferably 10 to 20 µm. When the number average diameter of the single yarn constituting the knitted fabric is within the range, yarn-making and production of the knitted fabric tend to be more facilitated.

The fineness of the single yarn constituting the knitted fabric is preferably 0.1 to 10 dtex, more preferably 0.3 to 6 dtex, further preferably 0.9 to 4 dtex. When the fineness of the single yarn constituting the knitted fabric is within the range, yarn-making and production of the knitted fabric tend to be more facilitated.

The fineness of the fiber constituting the knitted fabric is preferably 30 to 300 dtex, more preferably 40 to 250 dtex, further preferably 50 to 200 dtex. When the fineness of the fiber constituting the knitted fabric is within the range, yarn-making and production of the knitted fabric tend to be more facilitated. Herein, the "fiber" refers to a multifilament with a plurality of single yarns (monofilaments) collected.

The number of filaments per fiber constituting the knitted fabric is preferably 10 to 100, preferably 15 to 75, preferably 20 to 50. When the number of filaments per fiber is within the range, yarn-making and production of the knitted fabric tend to be more facilitated.

[Resin]

The resin with which the knitted fabric is impregnated is not particularly limited, and examples include polyurethane-based resins such as polyurethane and polyurethane polyurea; acrylic resins such as polyacrylate and polyacrylonitrile; vinyl resins such as polyvinyl chloride, polyvinyl acetate and polyvinylidene fluoride; polysulfone-based resins such as polysulfone and polyethersulfone; acylated cellulose-based resins such as acetylated cellulose and butyrylated cellulose; polyamide-based resins; and polystyrene-based resins.

Among them, the resin with which the knitted fabric is impregnated preferably includes a polyurethane-based resin. Examples of the polyurethane-based resin include, but not limited to the following, a polyester-based polyurethane resin, a polyether-based polyurethane resin and a polycarbonate-based polyurethane resin. When such a resin is used, the lapping rate tends to be more enhanced.

Such a resin with which the knitted fabric is impregnated may be used singly or in combinations of two or more thereof. In particular, in a preferable mode of the present embodiment, the resin preferably includes a first resin and a second resin different from the first resin.

The first resin is not particularly limited as long as it is a so-called wet-coagulatable resin with which the knitted fabric can be impregnated, and any of various known resins can be applied. Examples of such a resin include, but not limited to the following, a polyurethane-based resin, an acrylic resin, a vinyl resin, a polysulfone-based resin, an acylated cellulose-based resin, a polyamide-based resin and a polystyrene-based resin. Examples of the polyurethane-based resin include, but not limited to the following, a polyester-based polyurethane resin, a polyether-based polyurethane resin and a polycarbonate-based polyurethane resin. Herein, the "wet coagulation" means that impregnation of the knitted fabric with a resin solution in which the resin is dissolved and immersion of the resultant in a tank including a coagulation liquid (poor solvent to the resin.) thus result in coagulation and regeneration of the resin in the resin solution for impregnation. The solvent in the resin solution and the coagulation liquid are replaced with each other, thereby aggregating and coagulating the resin in the resin solution. Herein, the first resin is preferably soluble in one or more selected from the group consisting of N,N-dimethylformaldehyde, dimethylacetamide, methyl ethyl ketone and dimethylsulfoxide from the viewpoint of being used for wet coagulation.

The 100% modulus at 23±2° C. of the first resin is preferably 5 MPa to 30 MPa, more preferably 10 MPa to 20 MPa. The 100% modulus is a value obtained by dividing a load applied in elongation of a sheet made of the resin at 100%, namely elongation twice the original length, by the unit area.

The second resin is a so-called dry-coagulatable resin with which the knitted fabric can be impregnated, and is not particularly limited as long as it is a reaction product of a urethane prepolymer having an NCO equivalent of 400 or less and a curing agent, and any of various known resins can be applied. Herein, the "dry coagulation" means that impregnation of the knitted fabric with a liquid including a prepolymer and a curing agent and a reaction of the prepolymer and the curing agent thus result in formation of the resin. Herein, the liquid may also include a solvent.

The urethane prepolymer is not particularly limited, and examples include an adduct of hexamethylene diisocyanate and hexanetriol; an adduct of 2,4-tolylene diisocyanate and brenzcatechol; an adduct of tolylene diisocyanate and hexanetriol; an adduct of tolylene diisocyanate and trimethylolpropane; an adduct of xylylene diisocyanate and trimethylolpropane; an adduct of hexamethylene diisocyanate and trimethylolpropane; and an adduct of isocyanuric acid and hexamethylene diisocyanate. The urethane prepolymer may be used singly or in combinations of two or more thereof.

The NCO equivalent of the urethane prepolymer is preferably 400 or less, more preferably 220 to 400, further preferably 230 to 300. When the NCO equivalent of the urethane prepolymer is within the range, the lapping rate tends to be more enhanced. Herein, the "NCO equivalent" means the average NCO equivalent of the urethane prepolymer in the resin solution. The NCO equivalent can be measured by a well-known method, and can be measured according to JIS K 7301 (1995), for example.

The curing agent is not particularly limited, and examples include amine compounds such as 3,3'-dichloro-4,4'-diaminodiphenylmethane, 4-methyl-2,6-bis(methylthio)-1,3-benzenediamine, 2-methyl-4,6-bis(methylthio)-1,3-benzenediamine, 2,2-bis(3-amino-4-hydroxyphenyl)propane, 2,2-bis[3-(isopropylamino)-4-hydroxyphenyl]propane, 2,2-bis[3-(1-methylpropylamino)-4-hydroxyphenyl]propane, 2,2-bis[3-(1-methylpentylamino)-4-hydroxyphenyl]propane, 2,2-bis(3,5-diamino-4-hydroxyphenyl)propane, 2,6-diamino-4-methylphenol, trimethylethylene bis-4-aminobenzoate and polytetramethyleneoxide-di-p-aminobenzoate; and polyhydric alcohol compounds such as ethylene glycol, propylene glycol, diethylene glycol, trimethylene glycol, tetraethylene glycol, triethylene glycol, dipropylene glycol, 1,4-butanediol, 1,3-butanediol, 2,3-butanediol, 1,2-butanediol, 3-methyl-1,2-butanediol, 1,2-pentanediol, 1,4-pentanediol, 2,4-pentanediol, 2,3-dimethyltrimethylene glycol, tetramethylene glycol, 3-methyl-4,3-pentanediol, 3-methyl-4,5-pentanediol, 2,2,4-trimethyl-1,3-pentanediol, 1,6-hexanediol, 1,5-hexanediol, 1,4-hexanediol, 2,5-hexanediol, 1,4-cyclohexanedimethanol, neopentyl glycol, glycerin, trimethylolpropane, trimethylolethane and trimethylolmethane. The curing agent may be used singly or in combinations of two or more thereof.

The solvent is not particularly limited, and examples include N,N-dimethylformamide, N,N-dimethylacetamide and methyl ethyl ketone.

When the resin includes the first resin and the second resin different from the first resin, the content of the knitted fabric is preferably 30 to 60% by mass, more preferably 35 to 55% by mass based on the total amount of the knitted fabric, the first resin and the second resin. When content of the knitted fabric is within the range, the lapping rate tends to be more enhanced.

Herein, the respective contents of the knitted fabric, the first resin and the second resin can be determined from the mass of a component eluted or the mass of the residue by use of the difference in solubility (polarity) in a polar solvent and the difference in amine degradability. Alternatively, the contents can also be calculated by measuring the density of the lapping material after a primary impregnation step described below, the density of the lapping material after an immersion step described below and the density of the lapping material after a secondary impregnation step described below, respectively, and determining the density difference. Herein, the respective densities can be measured in the same manner as described above.

[Other Components]

The lapping material may also include, in addition to the knitted fabric and the resin, various additives included in a usual lapping material, for any purpose. Examples of such additives include, but not limited to the following, a pigment or filler such as carbon black, a hydrophilic additive and a hydrophobic additive.

The hydrophilic additive is not particularly limited, and examples include anionic surfactants such as sodium lauryl sulfate, carboxylate, sulfonate, a sulfate salt and a phosphate salt; and nonionic surfactants such as hydrophilic ester compound, ether compound, ester/ether compound and amide compound.

The hydrophobic additive is not particularly limited, and examples include nonionic surfactants to which an alkyl chain having 3 or more carbon atoms is added, such as polyoxyethylene alkyl ether, polyoxypropylene alkyl ether, polyoxyethylene polyoxypropylene alkyl ether, a perfluoroalkyl ethylene oxide adduct, glycerin fatty acid ester and propylene glycol fatty acid ester.

Furthermore, the lapping material may also include various remaining materials such as a solvent used in the production process thereof.

[Method for Producing Lapping Material]

A method for producing a lapping material of the present embodiment is not particularly limited as long as it is a method including a step of impregnating a knitted fabric with a resin and solidifying the resultant. For example, when a plurality of resins are used, the plurality of resins may be mixed and used for impregnating a knitted fabric at one time, or a multiple-stage impregnation step of impregnating a knitted fabric with a part of the resins and solidifying the resultant, and thereafter impregnating the knitted fabric with the remaining resin and solidifying the resultant may be included.

The method including the multiple-stage impregnation step by use of the first resin and the second resin is not particularly limited, and examples include a method including a primary impregnation step of impregnating a knitted fabric constituted by warp knitting or weft knitting with a resin solution including the first resin, and conducting wet coagulation to thereby provide a resin-impregnated knitted fabric, an immersion step of immersing the resin-impregnated knitted fabric in an immersion liquid including a solvent in which the first resin can be soluble, and a secondary impregnation step of impregnating the resin-impregnated knitted fabric after the immersion step with a solution including a urethane prepolymer having an NCO equivalent of 400 or less and a curing agent.

[Primary Impregnation Step]

The primary impregnation step is a step of impregnating a knitted fabric with a resin solution including the first resin and conducting wet coagulation to thereby provide a resin-impregnated knitted fabric. When a wet coagulation method is used with the knitted fabric being impregnated with the resin solution, replacement of a solvent in the resin solution with a coagulation liquid on the surface of the resin solution attached to a fiber of the knitted fabric is advanced in a coagulation liquid, thereby coagulating and regenerating the resin on the surface of the fiber.

A specific example of the primary impregnation step is as follows. First, the above first resin, a solvent in which the first resin can be soluble and which is miscible with a coagulation liquid described below, and, if necessary, other additive are mixed, and, if necessary, further subjected to defoaming under reduced pressure, thereby preparing a resin solution. The solvent is not particularly limited, and examples include N,N-dimethylformamide (DMF), N,N-dimethylacetamide (DMAC), methyl ethyl ketone (MEK) and dimethylsulfoxide. The first resin is preferably soluble in one or more solvents selected from the group consisting of N,N-dimethylformaldehyde, dimethylacetamide, methyl ethyl ketone and dimethylsulfoxide from the viewpoint of selection of a good solvent to the resin and furthermore from the viewpoint of uniform admixture in a coagulation bath for more facilitation of wet coagulation. Similarly, the solvent preferably includes one or more solvents selected from the group consisting of N,N-dimethylformaldehyde, dimethylacetamide, methyl ethyl ketone and dimethylsulfoxide.

The viscosity of the resin solution, measured with a B-type rotational viscometer at 20° C., is preferably 8000 cp or less, more preferably 100 cp to 5000 cp, further preferably 400 cp to 3000 cp from the viewpoint that the entire knitted fabric is impregnated with the resin and from the viewpoint that the amount of the resin for impregnation is sufficiently ensured. In order to obtain a resin solution having a viscosity in such a numerical range, for example, a polyurethane resin may be dissolved in the solvent in the range from 5 to 25% by mass, more preferably in the range from 8 to 20% by mass based on the total amount of the resin solution. The viscosity of the resin solution also depends on the type and the molecular weight of the resin to be used, and it is thus preferable to comprehensively consider them to thereby perform selection of the resin, setting of the concentration, and the like.

Next, the knitted fabric is sufficiently immersed in the resin solution, and thereafter the resin solution is squeezed away from the knitted fabric, to which the resin solution is attached, by use of a mangle roller where pressurization can be made between a pair of rollers, thereby adjusting the amount of the resin solution attached to the knitted fabric to a desired amount, to uniformly or substantially uniformly impregnate the knitted fabric with the resin solution. Next, the knitted fabric impregnated with the resin solution is immersed in a coagulation liquid mainly including a poor solvent to the resin, such as water, thereby coagulating and regenerating the resin (hereinafter, the resin to be wet-coagulated will be referred to as "wet resin".). An organic solvent such as a polar solvent other than the solvent in the resin solution may also be added to the coagulation liquid in order to adjust the regeneration rate of the resin. The temperature of the coagulation liquid is not particularly limited as long as it can allow the resin to be coagulated, and it may be, for example, 15 to 60° C.

In the present embodiment, it is preferable that the wet coagulation be conducted and thereafter the following washing/drying step be conducted. First, the knitted fabric where the wet resin is coagulated and regenerated is washed in a washing liquid such as water, thereby removing the solvent remaining in the knitted fabric, such as DMF. After washing, the knitted fabric is pulled up from the washing liquid, and an excess of the washing liquid is squeezed away by use of a mangle roller or the like. Thereafter, a knitted fabric base material may be dried in a drier at 100° C. to 150° C. After the drying, the resulting resin-impregnated knitted fabric is preferably further subjected to processing such as slicing or buffing, thereby removing a skin layer on the surface layer to impart a predetermined thickness, from the viewpoint of an enhancement in uniformity of the next step, an immersion step.

[Immersion Step]

The immersion step is a step of immersing the resin-impregnated knitted fabric in an immersion liquid including a solvent in which the first resin can be soluble, thereby partially re-dissolving the wet resin in the solvent. It is considered that the immersion step allows air bubbles (for example, a closed pore, and an open pore with a small opening) in the resin-impregnated knitted fabric to be decreased, thereby resulting in an enhancement in close contactability of the knitted fabric with the wet resin. The solvent for use in the immersion step is not particularly limited, and examples include N,N-dimethylformamide (DMF), N,N-dimethylacetamide (DMAC), methyl ethyl ketone (MEK) and dimethylsulfoxide. The temperature condition in such immersion is preferably 15.0 to 25.0° C. from the viewpoint of decreasing air bubbles in the first resin and also preventing elution of the resin into the solvent, and the immersion time is preferably 5 to 30 seconds from the same viewpoint. Herein, a drying step is preferably provided after the above immersion step.

[Secondary Impregnation Step]

The secondary impregnation step is a step of impregnating the resin-impregnated knitted fabric after the immersion step with a solution including a urethane prepolymer having an NCO equivalent of 400 or less and a curing agent. It is presumed that the secondary impregnation step allows a resin (hereinafter, this resin will be also referred to as "dry resin".) to be formed on the surface of the above wet resin.

In a specific example of the secondary impregnation step, first, a solution is prepared which includes a urethane prepolymer having an isocyanate group at an end, a curing agent, and a solvent in which these are soluble. The urethane prepolymer, the curing agent and the solvent that can be used here are the same as exemplified above.

Next, the resin-impregnated knitted fabric after the immersion step is immersed in the solution, and thereafter the solution is squeezed away from the resin-impregnated knitted fabric, to which the solution is attached, by use of a mangle roller where pressurization can be made between a pair of rollers, thereby adjusting the amount of the solution attached to the resin-impregnated knitted fabric to a desired amount, to uniformly or substantially uniformly impregnate the resin-impregnated knitted fabric with the solution. Next, the resin-impregnated knitted fabric impregnated with the solution is dried in a drier. Thus, the lapping material of the present embodiment can be obtained in which the resin-impregnated knitted fabric is impregnated with the dry resin by polymerization with the urethane prepolymer and the curing agent. The drying temperature may be, for example, 100° C. to 140° C.

The primary impregnation step, the immersion step and the secondary impregnation step described above are experienced to thereby provide the lapping material of the present embodiment, having a desired configuration. The lapping material, but is not intended to be limited to the following description, is presumed to have the following configuration. That is, the primary impregnation step is experienced to thereby form the wet resin on the surface of the knitted fabric. In particular, wet coagulation is adopted in the primary impregnation step to thereby allow the wet resin to be attached uniformly in the knitted fabric. The resin-impregnated knitted fabric obtained at this stage, however, has many fine air bubbles in the resin due to a wet coagulation method, and cannot be said to have sufficient close contactability of the knitted fabric with the wet resin and sufficient strength. Next, the immersion step is experienced to thereby allow fine air bubbles in the wet resin to be filled with an immersion solution, and the wet resin is re-dissolved with warming by drying, thereby decreasing fine air bubbles (for example, a closed pore, and an open pore with a small opening) in the resin-impregnated knitted fabric and also increasing the density of the resin (wet resin) with which the knitted fabric is impregnated, around the fiber, resulting in an enhancement in close contactability of the fiber of the knitted fabric with the wet resin and also an enhancement in strength. In addition, fine air bubbles are decreased, thereby leading to uniformity of impregnation with the dry resin in the secondary impregnation step, and an enhancement in strength. Furthermore, the secondary impregnation step is experienced to thereby allow an additional dry resin layer to be formed on the surface of the wet resin layer on the knitted fabric fiber.

According to the present embodiment, air bubbles are decreased in the immersion step, thereby resulting in securement of a space that can be impregnated in the secondary impregnation step and also an improvement in air permeability, to decrease a place into which the dry resin hardly penetrates, thereby increasing an area in which the dry resin is present. Therefore, uniform impregnation with the dry resin can be made. In addition, the wet resin on a portion not directly attached to the knitted fabric can be decreased, thereby suppressing peeling of the resin in the lapping material during polishing, to result in an increase in lifetime. Thus, it is presumed that the knitted fabric in the lapping material of the present embodiment acts as a base material and the wet resin layer is formed on the knitted fabric, thereby forming the dry resin layer on the wet resin layer. It is also presumed that both of close contactability of the knitted fabric and the wet resin layer and close contactability of the wet resin layer and the dry resin layer are favorable in the entire lapping material. It is considered from the above viewpoint that the lapping material of the present embodiment can ensure a sufficient strength.

The lapping material obtained as described above may, if necessary, be then cut to a desired shape such as a circular shape and a desired dimension and may be subjected to examination such as confirmation of whether or not there are contamination, foreign substances, and the like.

When the resulting lapping material, where the surface acts as a polishing surface, is used to polish a polishing workpiece (hereinafter, also referred to as "workpiece".), a double-faced tape (provided with an adhesion layer and a release sheet) for adhesion of the lapping material to a polishing platen of a polishing machine may also be applied in advance onto a surface of the lapping material, the surface being opposite to the polishing surface.

[Method for Producing Polished Product]

A method for producing a polished product of the present embodiment is not particularly limited as long as it is a method for producing a polished product, including a lapping step of lapping a workpiece by use of the lapping material. The lapping step may be primary lapping polishing (rough lapping), may be secondary lapping (finishing lapping), or may be a combination of both such polishing steps.

The workpiece is not particularly limited, and examples include a semiconductor device, a material for electronic components and the like, in particular, a Si substrate (silicon wafer), a SiC (silicon carbide) substrate, a GaAs (gallium arsenide) substrate and glass, and a thin substrate (workpiece) such as a substrate for hard disc or LCD (liquid crystal display). In particular, the method for producing a polished product of the present embodiment can be suitably used as a production method of a material to be applied to a power device, LED, and the like, for example, a difficult-to-process material which has a difficulty in polishing processing, such as sapphire, SiC, GaN and diamond.

A conventionally known method can be used as the lapping method, and is not particularly limited. Hereinafter, the method including lapping processing the workpiece by the lapping material in the presence of an abrasive grain will be described as an example.

The lapping method preferably includes an abrasive grain-embedding step of embedding an abrasive grain in the lapping material before lapping processing. In the abrasive grain-embedding step, the abrasive grain is embedded in the lapping material through a surface of the lapping material, the surface serving as a polishing surface S. Examples of the embedding method include a method including spreading a desired amount of the abrasive grain on the surface of the lapping material, and thereafter pushing the abrasive grain placed on the surface of the lapping material, toward the lapping material at a predetermined pressure, thereby embedding (charging) the abrasive grain. Examples of the means for use in such pushing include a retainer ring. In such spreading of the abrasive grain, the abrasive grain may be spread singly, but the abrasive grain is preferably spread by application with being dispersed in a dispersant from the viewpoint that the abrasive grain is prevented from being plurally aggregated mutually. The dispersant may be any one as long as it is a usual diamond abrasive grain dispersion liquid or a liquid for use in a polishing slurry including a diamond abrasive grain, and examples include a mixed liquid of glycerin and water.

The abrasive grain-embedding step may be provided before lapping processing of the workpiece by use of the lapping material, or may be provided during the lapping processing step. When embedding of the abrasive grain is conducted together with lapping processing, such embedding can be made by, with feeding of a polishing slurry including the abrasive grain onto the lapping material, pushing the abrasive grain on the lapping material by the workpiece toward the lapping material.

The abrasive grain is embedded in advance in the polishing surface S of the lapping material, and, in addition thereto, may be newly fed in lapping processing and embedded in the polishing surface of the lapping material, or may be released (released with not being embedded in the polishing surface of the lapping material, and/or embedded in the polishing surface once and thereafter released). As a result, the diamond abrasive grain can be closely secured onto only the polishing surface in the state of being high in polishing force, and not only the lapping rate can be increased, but also surface quality of the workpiece can be improved.

In the lapping method, first, the lapping material is mounted at a predetermined position of a lapping apparatus. Such mounting is made so that the lapping material is secured to the lapping apparatus with the adhesion layer interposed therebetween. The workpiece retained on a retaining platen which is disposed so as to be opposite to the lapping material as a lapping platen is then pressed on the polishing surface and also the lapping material and/or the retaining platen are/is rotated with a polishing slurry including a diamond abrasive grain being externally fed. Thus, the abrasive grain fed between the lapping material and the workpiece and embedded in the lapping material acts to subject lapping processing to a surface to be processed (surface to be polished) of the workpiece.

The polishing slurry preferably includes a diamond abrasive grain and a dispersant for dispersing the grain. The content rate of the diamond abrasive grain in the polishing slurry is not particularly limited, and is preferably 0.01 to 1.0% by mass based on the total amount of the polishing slurry from the viewpoint that lapping processing is more effectively conducted and also an affected layer of the workpiece is inhibited from being thicker. The average grain size of the diamond abrasive grain is preferably 0.5 to 20 µm, more preferably 1 to 18 µm, further preferably 2 to 15 µm, particularly preferably 3 to 10 µm. When the average grain size of the diamond abrasive grain is within the range, the lapping rate can be more enhanced and also the occurrence of scratches on a workpiece surface can be more suppressed.

Examples of the dispersant include water and an organic solvent, and an organic solvent is preferable from the viewpoint of more suppressing alteration of the workpiece. The organic solvent is preferably hydrocarbon, more preferably a hydrocarbon having a high boiling point. The hydrocarbon is not particularly limited, and examples include paraffin-based hydrocarbon, olefin-based hydrocarbon, aromatic hydrocarbon and alicyclic hydrocarbon. Examples of the hydrocarbon having a high boiling point include a petroleum-based hydrocarbon having an initial boiling point of 220° C. or more. Such solvents may be used singly or in combinations of two or more thereof. The solvent may also include, if necessary, other additive. Examples of such other additive include a nonionic surfactant, an anionic surfactant, carboxylate, carboxylic acid amide and carboxylic acid.

Herein, a solvent including no abrasive grain and optionally including an additive may be appropriately fed to the polishing surface of the lapping material from the viewpoint of suppressing a temperature rise due to the friction between the lapping material and the workpiece in lapping processing. Examples of the solvent and the additive here include those described above.

The workpiece is not particularly limited as long as it is conventional one to be subjected to lapping processing, and examples include a semiconductor wafer, a magnetic disc and optical glass. Among them, a semiconductor wafer is preferable, and a SiC substrate, a sapphire substrate or a GaN substrate is preferable from the viewpoint that the function effect of the lapping material of the present embodiment can be more effectively utilized. The material therefor is preferably a difficult-to-cut material such as a SiC single crystal and a GaN single crystal, and it may be a single crystal of sapphire, silicon nitride, aluminum nitride or the like.

EXAMPLES

Hereinafter, the present invention will be more specifically described with reference to Examples and Comparative Examples. The present invention is not intended to be limited to the following Examples.

[Type A Hardness]

A pressing needle (gauge head) was pressed on the surface of a test piece having a thickness of 4.5 mm or more, through a spring, and the type A hardness of the lapping material was measured from the pressing depth of the pressing needle after 30 seconds. A durometer type A was used as the measurement apparatus. Such measurement was conducted three times to provide the arithmetic average, thereby determine the type A hardness. Specifically, the lapping material was cut out to a size of 10 cm×10 cm, thereby providing a sample piece, and a plurality of such sample pieces were stacked so that the thickness was 4.5 mm or more.

[Compressibility and Compressive Elastic Modulus]

A Schopper type thickness gauge (pressurizing surface: a circle having a diameter of 1 cm) was used to measure the compressibility and the compressive elastic modulus of the lapping material according to Japanese Industrial Standards (JIS L 1021). Specifically, the thickness $t_0$ after pressurization with the initial load for 30 seconds was measured, and the thickness $t_1$ after standing under the final load for 5 minutes was then measured. After removal of all the loads and standing for 1 minute, the thickness $t_0'$ after pressurization with the initial load for 30 seconds was measured. Herein, the initial load was 100 g/cm$^2$ and the final load was 1120 g/cm$^2$. The compressibility was calculated according to the following expression (1), and the compressive elastic modulus was calculated according to the following expression (2).

compressibility (%)=$(t_0-t_1)/t_0 \times 100$  Expression (1):

compressive elastic modulus (%)=$(t_0'-t_1)/(t_0-t_1) \times 100$  Expression (2):

[Thickness]

A Schopper type thickness gauge (pressurizing surface: a circle having a diameter of 1 cm) was used to measure the thickness of the lapping material according to Japanese Industrial Standards (JIS K 6505). Specifically, three sample pieces each obtained by cutting out the lapping material to a size of 10 cm×10 cm were prepared, each of the sample pieces was set at a predetermined position of the thickness gauge, thereafter a pressurizing surface where a load of 480 g/cm$^2$ was applied was placed on the surface of each of the sample pieces, and the thickness was measured after a lapse of 5 seconds. The thickness was measured at five positions with respect to each of the sample pieces, to calculate the arithmetic average, and furthermore the arithmetic average of the three sample pieces was determined.

[Density]

The lapping material was cut out to a size of 10 cm×10 cm to provide a sample piece, the mass of the sample piece was measured, and the density (bulk density) (g/cm$^3$) of the lapping material was calculated from the volume determined from the size, and the mass.

[Surface Roughness Ra]

The surface roughness Ra of the polishing surface of the lapping material was measured with a laser microscope (LASER MICROSCOPE VK-X100 manufactured by Keyence Corporation).

[Lapping Processing Test]

The lapping material was disposed at a predetermined position of a double-sided lapping apparatus with a double-faced tape having an acrylic adhesive interposed, and a 2-inch 6H—SiC n-type wafer as a workpiece was subjected to a lapping processing test where lapping processing was made in the following conditions. In the lapping processing test, first, while a dispersion liquid including 0.1% by mass of a diamond abrasive grain (polycrystal, average grain size: 3 μm or 9 μm) and a mixed liquid (dispersant) of water and glycerin was dropped on the surface of the lapping material, pressing was made by a carrier made of SUS for a predetermined time to thereby embed the diamond abrasive grain in the lapping material, and then lapping processing was conducted.

(Lapping Conditions)

Size of platen of lapping apparatus used: 935 mm in diameter

Number of platen rotations: 10 rpm

Processing pressure: 278 g/cm$^2$

Lapping processing time: 1 hour (Lapping Rate)

The lapping rate (unit: μm/hr) was evaluated by using the amount of polishing determined from decrease in the mass of the workpiece before and after lapping processing, as well as the polishing area and the specific gravity of the workpiece, to calculate the thickness removed by lapping, to thereby determine the thickness removed per hour.

(Surface Quality)

Five of the workpieces after the lapping processing test were visually confirmed with respect to scratches on the polished surface. A case where the same surface quality as that in use of a copper platen and a 3-μm diamond abrasive grain was achieved was rated as "○", and a case where a more excellent surface quality was achieved than that rated as "○" was rated as "⊙".

[Knitted Fabric and Non-Woven Fabric]

Knitted fabrics A to C and non-woven fabrics A to B, each formed from a polyethylene terephthalate fiber, were prepared. The configuration of each knitted fabric is described in Table 1 below. Herein, a fiber constituting the front and rear surfaces of each knitted fabric and a fiber constituting the intermediate structure (located between the front surface and the rear surface) of each knitted fabric are separately described with respect to warp knitting and circular knitting.

TABLE 1

| | Knitting | Configuration of fiber | | | | |
|---|---|---|---|---|---|---|
| | | Position of fiber | Fineness of fiber/number of filaments | Grey yarn/ false twisted yarn | Fineness of single yarn | Thickness of knitted fabric |
| Knitted fabric A | Warp knitting, double raschel | Front and rear surfaces | E56T/24F | Grey yarn | 2.33 dtex | about 3 mm |
| | | Intermediate structure | E84T/36F | False twisted yarn | 2.33 dtex | |
| Knitted fabric B | Circular knitting, cardboard knitting | Front and rear surfaces | E167T/48F | False twisted yarn | 3.48 dtex | about 2.2 mm |
| | | Intermediate structure | E167T/48F, E84T/36F | False twisted yarn | 2.33 dtex | |
| Knitted fabric C | Warp knitting, double raschel | Front and rear surfaces | E56T/24F | Grey yarn | 2.33 dtex | about 3 mm |
| | | Intermediate structure | E110T/48F | Grey yarn | 2.29 dtex | |
| Non-woven fabric A | Non-woven fabric (needle punch) | — | — | — | 3.33 dtex | 2.4 mm |
| Non-woven fabric B | Non-woven fabric (needle punch) | — | — | — | 3.33 dtex | 4.2 mm |

Herein, knitted fabric A was a warp knitted fabric (double raschel) knitted by a double raschel machine having L1 to L6 of yarn feeders and configured by the following knitted fabric texture, and a false twisted yarn was fed through L3 and L4 and grey yarn was fed through L1, L2, L5 and L6. With respect to knitted fabric C, grey yarn was fed through all of L1 to L6.

L1: 4-4-4-4/0-0-0-0//
L2: 0-1-1-1/1-0-0-0//
L3: 0-1-1-2/1-0-2-1//
L4: 1-2-0-1/2-1-1-0//
L5: 0-0-0-1/1-1-1-0//
L6: 0-0-4-4/4-4-0-0//

Knitted fabric B was a circle knitted fabric (cardboard knitted fabric) knitted by a circular knitting machine having F1 to F6 of yarn feeders and configured by the following knitted fabric texture.

F1: tuck (tuck texture made by an odd-numbered cylinder needle and an even-numbered dial needle (one knitting overlapped with the next knitting))
F2: half dial (not knitting with any cylinder, but knitting with only an odd-numbered dial needle)
F3: half cylinder (not knitting with any dial, but knitting with only an even-numbered cylinder needle)
F4: tuck knitting (opposite of F1, tuck texture made by an even-numbered cylinder needle and an odd-numbered dial needle)
F5: half dial (opposite of F2, not knitting with any cylinder, but knitting with only an even-numbered dial needle)
F6: half cylinder (opposite of F3, not knitting with any dial, but knitting with only an even-numbered cylinder needle)

Example 1

(Primary Impregnation Step)

Mixed were 56.7 parts by mass of a polycarbonate-based urethane resin (produced by DIC Corporation, trade name "Crisvon S705") and 43.3 parts by mass of N,N-dimethylformamide, thereby preparing a resin solution. Knitted fabric A was immersed in the resulting resin solution, and an excess of the resin solution was squeezed away by use of a mangle roller, thereby substantially uniformly impregnating knitted fabric A with the resin solution. Next, knitted fabric A was immersed in a coagulation liquid including water at 18° C., thereby coagulating and regenerating a resin for primary impregnation, to provide a resin-impregnated knitted fabric. Thereafter, the resin-impregnated knitted fabric was taken out from the coagulation liquid and dried, and subjected to buffing, to thereby provide a resin-impregnated knitted fabric from which a surface skin layer was removed.

(Immersion Step)

Next, the resin-impregnated knitted fabric obtained above was immersed in an immersion solvent where N,N-dimethylformamide and pure water were mixed in a ratio of 65:35. Thereafter, drying was conducted to provide a resin-impregnated knitted fabric after the immersion step.

(Secondary Impregnation Step)

Furthermore, 24.11 parts by mass of a urethane prepolymer (produced by DIC Corporation, trade name "Pandex TM363", NCO equivalent: 286), 10.91 parts by mass of a curing agent (produced by DIC Corporation, trade name "Pandex E") and 60.04 parts by mass of N,N-dimethylformamide were mixed to prepare a resin solution. The resin-impregnated knitted fabric after the immersion step was immersed in the resulting resin solution. Thereafter, washing/drying was conducted to provide a lapping material of Example 1. The content of the knitted fabric in the entire lapping material was 37% by mass. Herein, the NCO equivalent was measured according to JIS K 7301 (1995) (The same shall apply hereunder).

Examples 2 to 3

A lapping material of each of Examples 2 to 3 was obtained by the same method as in Example 1 except that knitted fabric B was used instead of knitted fabric A. The content of the knitted fabric in the entire lapping material of each of Examples 2 to 3 was 53% by mass.

Example 4

A lapping material of Example 4 was obtained by the same method as in Example 1 except that knitted fabric C was used instead of knitted fabric A. The content of the knitted fabric in the entire lapping material was 55% by mass.

Comparative Example 1

A lapping material of Comparative Example 1 was obtained by the same method as in Example 1 except that non-woven fabric A was used instead of knitted fabric A. The content of the non-woven fabric in the entire lapping material was 34% by mass.

Comparative Example 2

(Primary Impregnation Step)
Mixed were 45.7 parts by mass of an ester-based urethane resin (produced by DIC Corporation, trade name "Crisvon 7667"), 1.4 parts by mass of a urethane prepolymer (produced by DIC Corporation, trade name "Burnock DN950") as a crosslinking agent and 52.9 parts by mass of N,N-dimethylformamide, thereby preparing a resin solution. Non-woven fabric B was immersed in the resulting resin solution, and an excess of the resin solution was squeezed away by use of a mangle roller, thereby substantially uniformly impregnating non-woven fabric B with the resin solution. Next, non-woven fabric B was immersed in a coagulation liquid including water at 18° C., thereby coagulating and regenerating a resin for primary impregnation, to provide a resin-impregnated non-woven fabric. Thereafter, the resin-impregnated non-woven fabric was taken out from the coagulation liquid and dried, and subjected to buffing, to provide a resin-impregnated woven fabric from which a surface skin layer was removed.

(Immersion Step)
Next, the resin-impregnated non-woven fabric obtained above was immersed in an immersion solvent where N,N-dimethylformamide and pure water were mixed in a ratio of 65:35. Thereafter, drying was conducted to provide a resin-impregnated non-woven fabric after the immersion step.

(Secondary Impregnation Step)
Furthermore, 31.15 parts by mass of a urethane prepolymer (produced by Mitsubishi Plastics, Inc., trade name "Novaretan UP121", NCO equivalent: 440), 7.85 parts by mass of a curing agent (produced by DIC Corporation, trade name "Pandex E") and 57.24 parts by mass of N,N-dimethylformamide were mixed to prepare a resin solution. The resin-impregnated non-woven fabric after the immersion step was immersed in the resulting resin solution. Thereafter, washing/drying was conducted to provide a lapping material of Comparative Example 2. The content of the non-woven fabric in the entire lapping material was 33% by mass.

Figure 2:
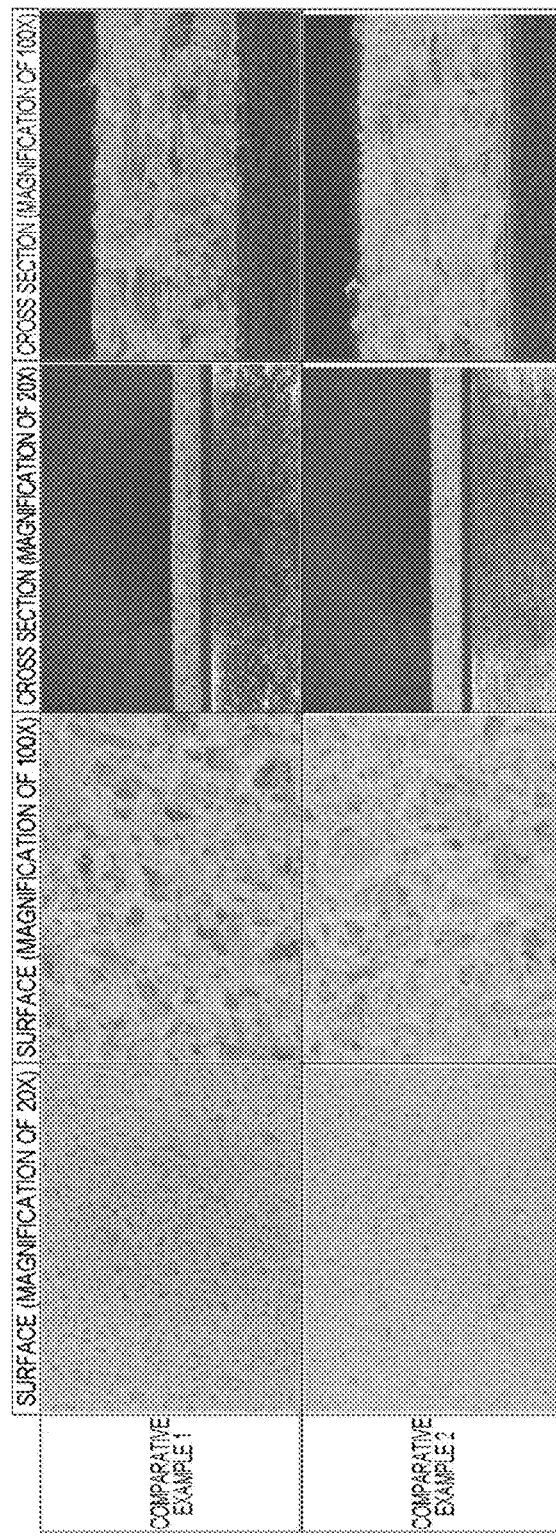
FIG. 2 shows microscope photographs illustrating the surfaces and the cross sections of lapping materials obtained in each of Comparative Examples 1 and 2.

Table 2 shows the hardness, the compressibility, the compressive elastic modulus, the thickness, the density and the surface roughness Ra of the lapping material obtained in each of Examples and Comparative Examples described above. In addition, the evaluation results of the lapping rate and the surface quality are also shown therein. In addition, FIG. 1 shows microscope photographs illustrating the surfaces and the cross sections of the lapping materials obtained in each of Examples 1, 2 and 4, and FIG. 2 shows microscope photographs illustrating the surfaces and the cross sections of the lapping materials obtained in each of Comparative Examples 1 and 2.

TABLE 2

|  | Type A hardness | Compressibility (%) | Compressive elastic modulus (%) | Thickness (mm) | Density (g/cm$^3$) | Surface roughness (μm) | Diamond abrasive grain Diameter | Lapping processing test | |
|---|---|---|---|---|---|---|---|---|---|
|  |  |  |  |  |  |  |  | Lapping rate Workpiece/ polishing method | Surface quality |
| Example 1 | 75.0 | 2.0 | 82.6 | 2.9 | 0.40 | 47.67 | Polycrystal 9 μm | 16.38 μm/h SiC-DMP | ○ |
| Example 2 | 92.0 | 2.7 | 85.3 | 2.2 | 0.55 | 34.01 | Polycrystal 9 μm | 4.14 μm/h SiC-DMP | ◎ |
| Example 3 | 92.0 | 2.7 | 85.3 | 2.2 | 0.55 | 34.01 | Polycrystal 3 μm | 5.58 μm/h SiC-DMP | ◎ |
| Example 4 | 79.0 | 2.9 | 77.8 | 2.0 | 0.40 | 70.15 | Polycrystal 9 μm | 2.18 μm/h SiC-DMP | ○ |
| Comparative Example 1 | 75.0 | 6.1 | 57.0 | 1.3 | 0.37 | 45.32 | Polycrystal 9 μm | 1.48 μm/h SiC-DMP | ○ |
| Comparative Example 2 | 70.0 | 6.7 | 58.6 | 1.3 | 0.42 | 56.30 | Polycrystal 9 μm | 1.1 μm/hr SiC-DMP | ○ |

*DMP: diamond mechanical polishing

The present application is based on Japanese Patent Application (Japanese Patent Application No. 2015-211275) filed with Japan Patent Office on Oct. 27, 2015, the content of which is herein incorporated as reference.

INDUSTRIAL APPLICABILITY

The present invention has industrial applicability to a lapping material, in particular, a lapping material for a difficult-to-cut material.

The invention claimed is:
1. A lapping material comprising:
a polishing surface comprising a knitted fabric constituted by warp knitting or weft knitting, wherein at least a part of a fiber constituting the knitted fabric is a false twisted yarn; and
a resin with which the knitted fabric is impregnated, wherein the resin comprises a first resin and a second resin different from the first resin, and wherein the second resin is a reaction product of a urethane prepolymer having an NCO equivalent of 300 or less and a curing agent, and wherein a content of the knitted fabric is 30 to 60% by mass based on a total amount of the knitted fabric, the first resin, and the second resin, wherein a surface roughness Ra of the polishing surface is 25 to 80 μm, and wherein a number average diameter of a single yarn constituting the knitted fabric is 3 to 30 μm.

2. The lapping material according to claim 1, having a compressibility of 0.5 to 20%.

3. The lapping material according to claim 1, having a compressive elastic modulus of 50 to 98%.

4. The lapping material according to claim 1, having a type A hardness of 50 to 98°.

5. The lapping material according to claim 1, having a thickness of 1.0 to 5.0 mm.

6. A method for producing a polished product, comprising:
  a lapping step of lapping a workpiece by use of the lapping material according to claim 1.

7. The lapping material of claim 1, wherein the polishing surface further comprises an abrasive grain embedded in a surface of the lapping material.

8. A method for producing a lapping material, comprising:
  a primary impregnation step of impregnating a knitted fabric constituted by warp knitting or weft knitting, wherein at least a part of a fiber constituting the knitted fabric is a false twisted yarn, with a resin solution comprising a first resin, and conducting wet coagulation to thereby provide a resin-impregnated knitted fabric,
  an immersion step of immersing the resin-impregnated knitted fabric in an immersion liquid comprising a solvent in which the first resin can be soluble, and
  a secondary impregnation step of impregnating the resin-impregnated knitted fabric after the immersion step with a second resin which is a reaction product comprising a urethane prepolymer having an NCO equivalent of 300 or less and a curing agent,
  wherein a content of the knitted fabric is 30 to 60% by mass based on a total amount of the knitted fabric, the first resin, and the second resin,
  wherein a surface roughness Ra of the polishing surface is 25 to 80 μm, and wherein a number average diameter of a single yarn constituting the knitted fabric is 3 to 30 μm.

9. The method for producing a lapping material according to claim 8, wherein the first resin can be soluble in one or more selected from the group consisting of N,N-dimethylformaldehyde, dimethylacetamide, methyl ethyl ketone and dimethylsulfoxide.

10. The method for producing a lapping material according to claim 8, wherein the solvent comprises one or more solvents selected from the group consisting of N,N-dimethylformaldehyde, dimethylacetamide, methyl ethyl ketone and dimethylsulfoxide.

* * * * *